(12) United States Patent
Shibata

(10) Patent No.: US 7,245,533 B2
(45) Date of Patent: Jul. 17, 2007

(54) SEMICONDUCTOR MEMORY DEVICE WITH REDUCED NUMBER OF HIGH-VOLTAGE TRANSISTORS

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/058,192

(22) Filed: Feb. 16, 2005

(65) Prior Publication Data

US 2006/0050560 A1    Mar. 9, 2006

(30) Foreign Application Priority Data

Sep. 7, 2004    (JP) .............................. 2004-260033

(51) Int. Cl.
*G11C 16/04* (2006.01)
(52) U.S. Cl. .......................... 365/185.17; 365/185.29; 365/185.33
(58) Field of Classification Search ........... 365/185.17, 365/185.29, 185.33
See application file for complete search history.

(56) References Cited

U.S. PATENT DOCUMENTS

| 6,614,684 B1 * | 9/2003 | Shukuri et al. ........ 365/185.05 |
| 7,016,229 B2 * | 3/2006 | Kim ...................... 365/185.17 |
| 7,023,741 B2 * | 4/2006 | Nakamura et al. ..... 365/189.04 |

FOREIGN PATENT DOCUMENTS

JP    8-46159    2/1996

* cited by examiner

*Primary Examiner*—David Lam
(74) *Attorney, Agent, or Firm*—Oblon, Spivak, McClelland, Maier & Neustadt, P.C.

(57) ABSTRACT

In a memory cell array, a plurality of memory cells connected to word lines and bit lines are arranged in a matrix. A control circuit controls the potential on the word lines and bit lines according to the input data. The control circuit further controls the operations of writing data into, reading data from, and erasing data from the memory cells. A data storage circuit is connected to the bit lines and stores data under the control of the control circuit. The data storage circuit and the memory cell array are formed in the same well region.

18 Claims, 5 Drawing Sheets

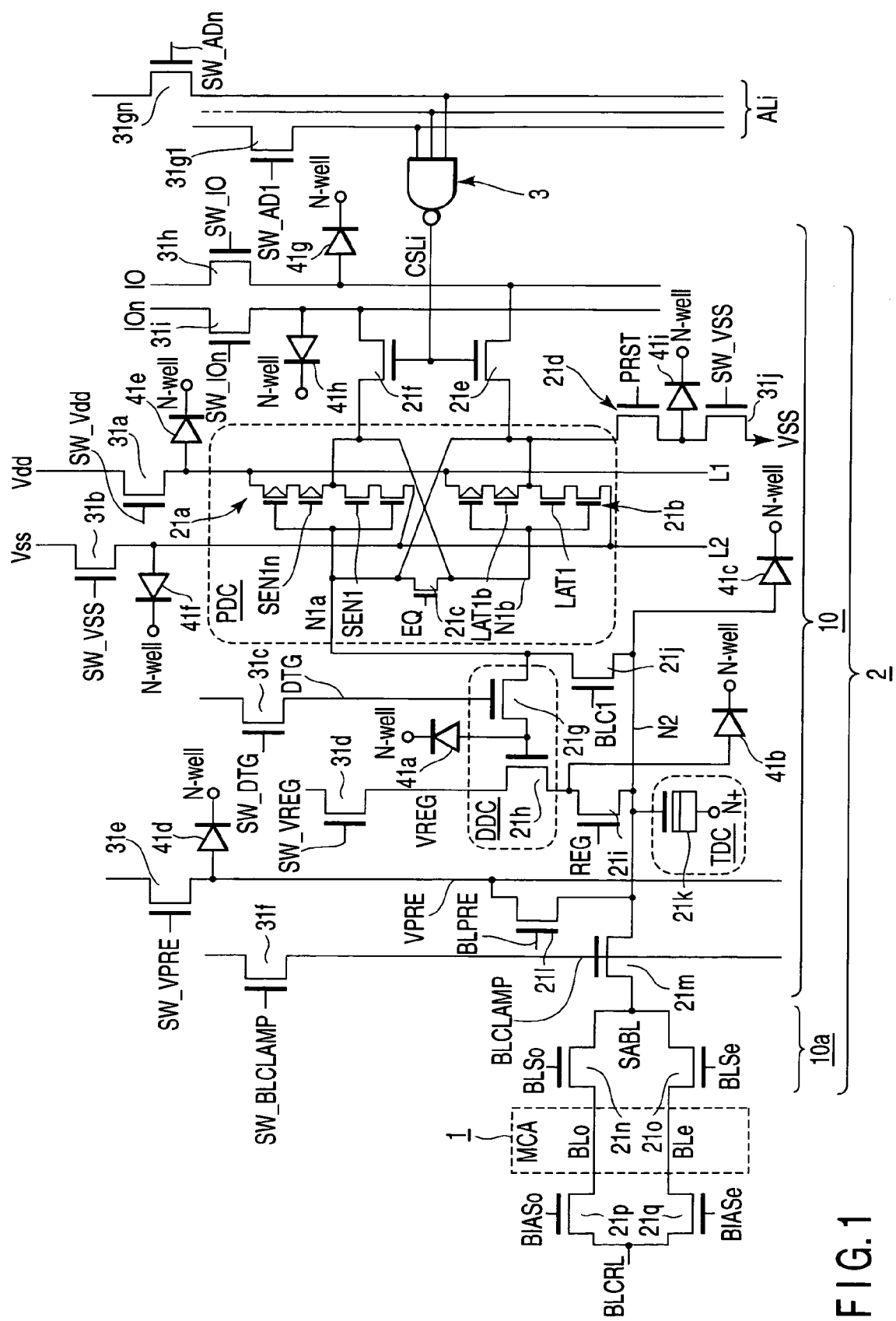
F I G. 1

|  | P-Sub (51) | N-well (52) | N-well (53) | P-well (56) | P-well (55) | N-well (54) | N+ (58) |
|---|---|---|---|---|---|---|---|
| In normal operation | Vss | Vss | Vdd | Vss | Vss | Vss | Vss |
| In erase operation | Vss | Vera | Vera | Vera | Vss | Vdd | Vera |

FIG. 5

SEMICONDUCTOR MEMORY DEVICE WITH REDUCED NUMBER OF HIGH-VOLTAGE TRANSISTORS

CROSS-REFERENCE TO RELATED APPLICATIONS

This application is based upon and claims the benefit of priority from prior Japanese Patent Application No. 2004-260033, filed Sep. 7, 2004, the entire contents of which are incorporated herein by reference.

BACKGROUND OF THE INVENTION

1. Field of the Invention

This invention relates to a semiconductor memory device capable of erasing simultaneously the data stored in a plurality of memory cells.

2. Description of the Related Art

One known nonvolatile semiconductor memory device capable of erasing all data simultaneously is a NAND flash memory. In a NAND flash memory, a plurality of memory cells and select gates arranged in the column direction are connected in series, thereby constituting one NAND cell. Each NAND cell is connected to the corresponding bit line via a select gate. For example, two adjacent bit lines are connected to a data storage circuit. The data storage circuit not only holds the write data externally supplied in writing the data but also holds the data read from the memory cell in reading the data.

In writing the data or reading the data, all of or half of the cells arranged in the row direction are written into or read from at a time. In an erase operation, when a high voltage is applied to a well region in which a memory cell array is formed and the word line for the selected cell is set to Vss and the word lines for the unselected cells are brought into the floating state, a high voltage is applied between the gate and well region of the selected cell. As a result, electrons escape from the floating gate into the substrate, with the result that the threshold voltage of the cell becomes negative. During the erase operation, the gates of the unselected cells are in the floating state. Accordingly, when the high voltage is applied to the well region, the voltages of the word lines also become high by coupling, with the result that the voltage between the gate and well regions of the selected cell does not become high, which prevents the data from being erased.

In the erase operation, the voltage of the well region where a memory cell is formed is made high, with the result that the voltage on the bit line connected to the drain of the memory cell becomes high. However, the data storage circuit connected to the bit line and the peripheral circuit for supplying a potential to the bit line are composed of low-voltage transistors incapable of withstanding a high voltage. Therefore, to protect the low-voltage transistors, a high-voltage transistor is connected between one end of the bit line and the data storage circuit and between the other end of the bit line and the peripheral circuit. In an erase operation, the transistors are turned off, thereby preventing the high voltage from being supplied to the data storage circuit and peripheral circuit.

As the elements are miniaturized further, low-voltage transistors are made smaller. However, high-voltage transistors are difficult to miniaturize. As the capacity of a semiconductor memory device is getting larger, the number of bit lines increases and therefore the number of high-voltage transistors connected to the bit lines increases, which becomes a problem. For example, a 4-Gbit NAND flash memory has 32K data storage circuits, which then include as many as 128K high-voltage transistors, four times the number of data storage circuits. The number of high-voltage transistors increases as the memory capacity increases. As a result, the percentage of high-voltage transistors occupying the chip becomes larger, which makes it difficult to reduce the chip area.

To overcome this difficulty, the technique for reducing the number of high-voltage transistors by connecting two high-voltage transistors equally to two bit lines (for example, refer to Jpn. Pat. Appln. KOKAI Publication No. 8-46159). By this technique, the number of high-voltage transistors can be halved as compared with a conventional equivalent. However, the technique has the following problem: as the memory capacity increases, the number of high-voltage transistors increases accordingly.

BRIEF SUMMARY OF THE INVENTION

According to a first aspect of the present invention, there is provided a semiconductor memory device comprising: a memory cell array in which a plurality of memory cells connected to word lines and bit lines are arranged in a matrix; a control circuit which controls the potential on the word lines and bit lines according to input data and which controls the operations of writing data into, reading data from, and erasing data from the memory cells; a data storage circuit which is connected to the bit lines and which stores data under the control of the control circuit; and a well region in which the data storage circuit and the memory cell array are formed.

According to a second aspect of the present invention, there is provided a semiconductor memory device comprising: a memory cell array in which a plurality of memory cells connected to a plurality of bit lines are arranged; a control circuit which controls the potential on the bit lines and which controls the operations of writing data into and reading data from, and erasing data from the memory cells; a plurality of data storage circuits which are connected to the bit lines in a one-to-one correspondence and which store data; a plurality of high-voltage transistors which are connected to a plurality of wiring lines that provide common connection of the plurality of data storage circuits and the control circuit, in such a manner that the transistors are inserted in the wiring lines in a one-to-one correspondence; and a well region in which the plurality of data storage circuits and the memory cell array are formed.

According to a third aspect of the present invention, there is provided a semiconductor memory device comprising: a memory cell array which has a plurality of memory cells connected to a plurality of bit lines; a control circuit which controls the potential on the bit lines and which controls the operations of writing data into and reading data from, and erasing data from the memory cells; a plurality of data storage circuits which are connected to the bit lines and which store data; a first well region in which the data storage circuits is formed; and a second well region in which the memory cell array is formed, wherein the first and second well regions are supplied with the same potential during an erase operation.

BRIEF DESCRIPTION OF THE SEVERAL VIEWS OF THE DRAWING

FIG. 1 is a circuit diagram of a memory cell array and a bit line control circuit according to an embodiment of the present invention;

FIG. 5 is a view explain the operation of the embodiment.

DETAILED DESCRIPTION OF THE INVENTION

Hereinafter, referring to the accompanying drawings, an embodiment of the present invention will be explained.

Figure 2:
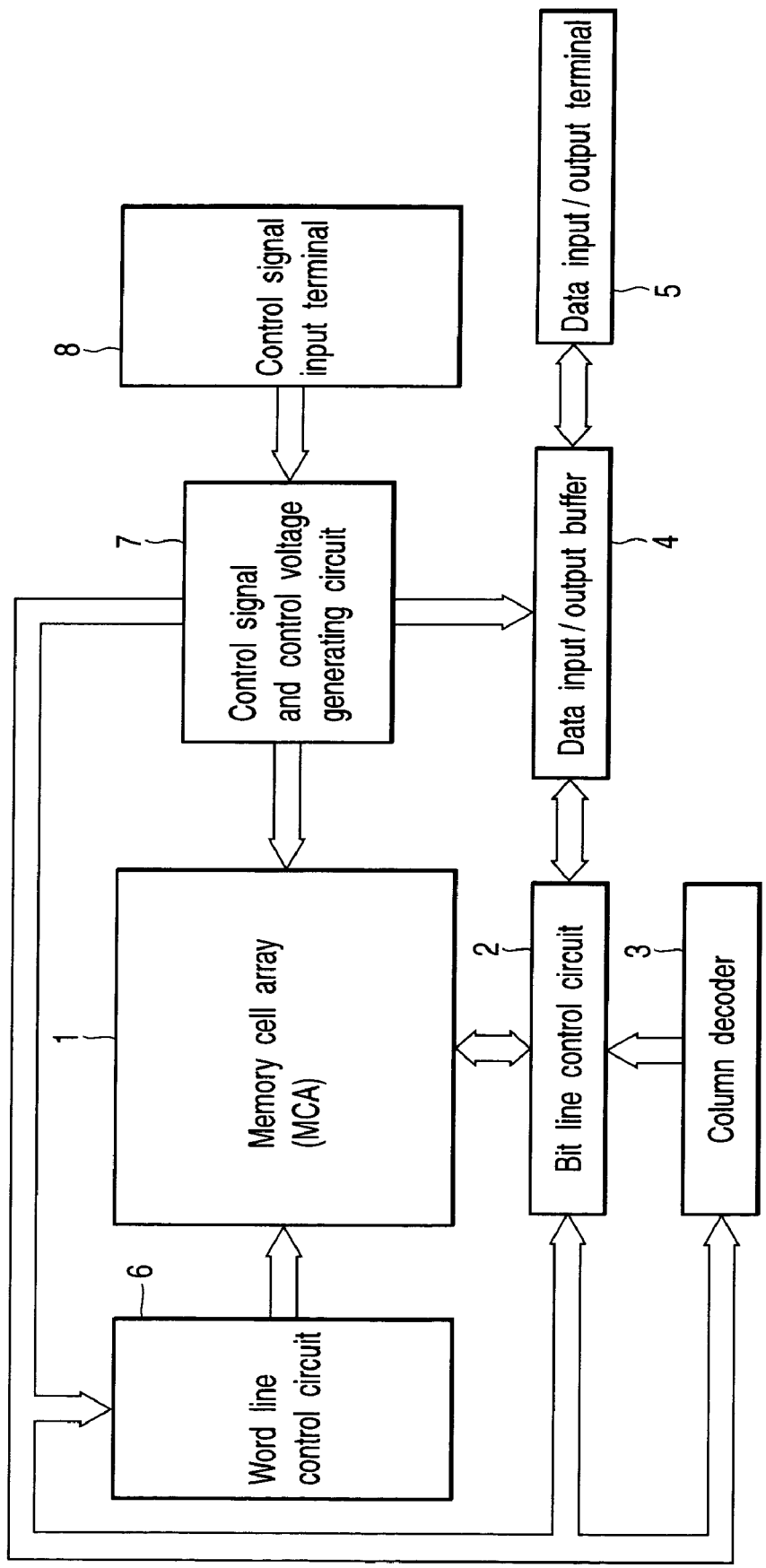
FIG. 2 schematically shows the configuration of a nonvolatile semiconductor memory device.

FIG. 2 shows the configuration of a nonvolatile semiconductor memory device, such as a NAND flash memory.

A memory cell array 1 includes a plurality of bit lines, a plurality of word lines, and a common source line. In the memory cell array 1, electrically rewritable memory cells composed of, for example, EEPROM cells are arranged in a matrix. A bit line control circuit 2 for controlling bit lines and a word line control circuit 6 are connected to the memory cell array 1.

The bit line control circuit 2 includes a plurality of data storage circuits as described later. The bit line control circuit 2 reads the data from the memory cell array 1 via a bit line, detects the state of a memory cell in the memory cell array 1 via a bit line, and writes data into a memory cell in the memory cell array 1 by applying a write control voltage via a bit line. A column decoder 3 and a data input/output buffer 4 are connected to the bit line control circuit 2. A data storage circuit in the bit line control circuit 2 is selected by the column decoder 3. The data in the memory cell read into the data storage circuit passes through the data input/output buffer 4 and is output from a data input/output terminal 5 to the outside.

The write data externally input to the data input/output terminal 5 passes through the data input/output buffer 4 to the data storage circuit selected by the column decoder 3.

A word line control circuit 6 is connected to the memory cell array 1. The word line control circuit 6 selects a word line in the memory cell array 1, reads the data onto the selected word line, and applies a voltage necessary for writing or erasing.

The memory cell array 1, bit line control circuit 2, column decoder 3, data input/output buffer 4, and word line control circuit 6, which are connected to a control signal and control voltage generating circuit 7, are controlled by the control signal and control voltage generating circuit 7. The control signal and control voltage generating circuit 7, which is connected to a control signal input terminal 8, is controlled by a control signal inputted via the control signal input terminal 8 from the outside.

The bit line control circuit 2, column decoder 3, word line control circuit 6, and control signal and control voltage generating circuit 7 constitute a write circuit and a read circuit.

Figure 3:
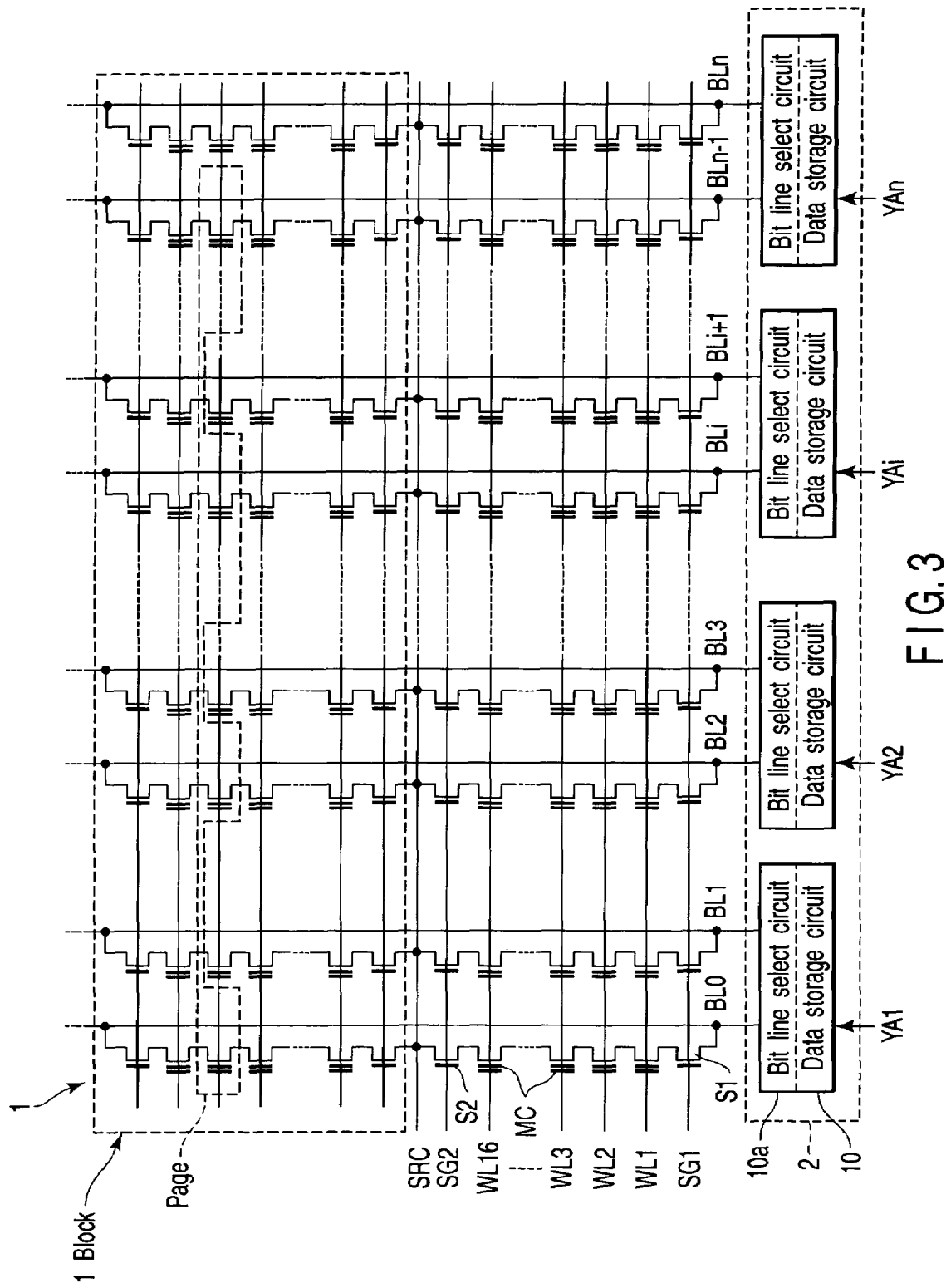
FIG. 3 is a circuit diagram of the main part of FIG. 2.

FIG. 3 shows a configuration of the memory cell array 1 and bit line control circuit 2 shown in FIG. 2. A plurality of NAND cells are arranged in the memory cell array 1. A NAND cell is composed of a memory cell made up of, for example, 16 EEPROMs connected in series, and a first and a second select gate S1, S2. The first select gate S1 is connected to bit line BL0 and the second select gate S2 is connected to source line SRC. The control gates of the memory cells arranged in each row are connected equally to word lines WL1, WL2, WL3 to WL16. The first select gates S1 are connected equally to select line S1 and the second select gates S2 are connected equally to select line SG2.

The bit line control circuit 2 has a plurality of data storage circuits 10. A pair of bit lines (BL0, BL1), (BL2, BL3), . . . , (BLi, BLi+1), . . . , (BLn−1, BLn) is connected to the corresponding one of the data storage circuits 10. Each data storage circuit 10 is connected to one of a pair of bit lines via a bit line select circuit 10a explained later.

The memory cell array 1 includes a plurality of blocks as shown by a broken line. Each block is composed of a plurality of NAND cells. Data is erased in blocks. An erase operation is carried out simultaneously on the two bit lines connected to the data storage circuit 10.

In a read operation, a program verify operation, and a program operation, one of the two bit lines connected to the data storage circuit 10 is selected according to an externally specified address signal. In addition, according to the external address, a word line is selected, thereby selecting a page. Pages are switched according to an address.

FIG. 1 shows an example of the memory cell array and bit line control circuit of FIG. 3 according to the embodiment. The data storage circuit 10 includes a primary data cache (PDC), a dynamic data cache (DDC), and a temporary data cache (TDC). The PDC and DDC hold the input data in a write operation, hold the read data in a read operation, and temporarily hold the data in a verify operation, and are used to manipulate internal data in storing the data. The TDC amplifies the data on the bit line in reading the data and temporarily holds the data, and is used to manipulate internal data in storing the data.

The PDC is composed of clocked inverter circuits 21a, 21b, and a transistor 21c which constitute a latch circuit. The clocked inverter circuit 21a is controlled by complementary signals SEN1n, SEN1. The clocked inverter circuit 21b is controlled by complementary signals LAT1b, LAT1. The transistor 21c is connected between the input terminal of the clocked inverter circuit 21a and the input terminal of the clocked inverter circuit 21b. A signal EQ is supplied to the gate of the transistor 21c. A transistor 21d is connected to the output terminal of the clocked inverter circuit 21b. A signal PRST is supplied to the gate of the transistor 21d. A node N1a of the PDC is connected to an input/output data line IO via a column select transistor 21e. A node N1b of the PDC is connected to an input/output data line IOn via a column select transistor 21f. A column select signal CSLi is supplied to the gates of the transistors 21e, 21f. The column select signal CSLi is output from the column decoder 3. The input terminal of the column decoder 3 is connected to a plurality of address lines ALi.

The node N1a of the PDC is connected to the DDC. The DDC is composed of transistors 21g, 21h. One end of the current path of the transistor 21g is connected to the node N1a and the other end of the current path is connected to the gate of the transistor 21h. A signal DTG is supplied to the gate of the transistor 21g. A signal VREG is supplied to one end of the transistor 21h. The other end of the transistor 21h is connected via a transistor 21i to a node N2. A signal REG is supplied to the gate of the transistor 21i. One end of the current path of the transistor 21g is connected via a transistor 21j to the node N2. A signal BLC1 is supplied to the gate of the transistor 21j.

The TDC is composed of, for example, a MOS capacitor 21k. The capacitor 21k is connected between the node N2 and an N+ region.

Further connected to the junction node N2 is one end of the current path of each of the transistors 21l, 21m. A signal VPRE is supplied to the other end of the current path of the transistor 21*l*. A signal BLPRE is supplied to the gate of the transistor 21*l*. A signal BLCLAMP is supplied to the gate of the transistor 21*m*.

One end of the current path of transistors 21*n*, 21*o* constituting the bit line select circuit 10*a* is connected to the other end of the current path of the transistor 21*m*. The other end of the current path of the transistor 21*n* is connected to one end of a bit line BLo. The other end of the current path of the transistor 21*o* is connected to one end of a bit line BLe. A signal BLSo is supplied to the gate of the transistor 21*n*. A signal BLSe is supplied to the gate of the transistor 21*o*. The transistors 21*n*, 21*o* are turned on according to the signals BLSo, BLse, thereby selectively connecting the bit lines BLo, BLe to the data storage circuit 10.

The other end of the bit line BLo is connected to one end of the current path of a transistor 21*p*. A signal BIASo is supplied to the gate of the transistor 21*p*. The other end of the bit line BLe is connected to one end of the current path of a transistor 21*q*. A signal BIASe is supplied to the gate of the transistor 21*q*. A signal BLCRL is supplied to the other ends of the current paths of the transistors 21*p*, 21*q*. The transistors 21*p*, 21*q* are turned on according to the signals BIASo, BIASe, thereby supplying the potential of the signal BLCRL to the unselected bit lines.

The clocked inverter circuits 21*a*, 21*b* and transistors 21*c* to 21*m* in the data storage circuit 10, the transistors 21*n*, 21*o* constituting the bit line select circuit 10*a*, the transistors 21*p*, 21*q*, and the column decoder 3 are made up of low-voltage transistors. The data storage circuit 10, bit line select circuit 10*a*, transistors 21*p*, 21*q*, and column decoder 3 are formed in the same well region as the memory cell array 1.

The various signals and voltages supplied to the data storage circuit 10, bit line select circuit 10*a*, transistors 21*p*, 21*q* are generated by the control signal and control voltage generating circuit 7 shown in FIG. 2. The various signals and voltages generated by the control signal and control voltage generating circuit 7 are supplied via high-voltage transistors to the data storage circuit 10, bit line select circuit 10*a*, transistors 21*p*, 21*q*.

Specifically, a power line L1 for supplying a power supply voltage Vdd to the clocked inverter circuits 21*a*, 21*b* and a power line L2 for supplying the ground voltage Vss are connected to the control signal and control voltage generating circuit 7 via high-voltage transistors 31*a*, 31*b*. Signals SW_Vdd, SW_Vss are supplied to the gates of the transistors 31*a*, 31*b*, respectively. The complementary signals SEN1*n*, SEN1, LAT1*b*, LAT1 for controlling the clocked inverter circuits 21*a*, 21*b* are also supplied to the clocked inverter circuits 21*a*, 21*b* via high-voltage transistors (not shown). In addition, the signals EQ, PRST are also supplied via high-voltage transistors (not shown) to the gates of the transistors 21*c*, 21*d*, respectively.

In the DDC, the signal DTG is supplied to the gate of the transistor 21*g* via a high-voltage transistor 31*c*. The signal VREG is supplied to the current path of the transistor 21*h* via a high-voltage transistor 31*d*. Signals SW_DTG, SW_VREG are supplied to the gates of the transistors 31*c*, 31*d*, respectively. The signals REG, BLC1 are supplied to the gates of the transistors 21*i*, 21*j*, respectively, via high-voltage transistors (not shown).

Furthermore, the signal VPRE is supplied to the current path of the transistor 21*l* via a high-voltage transistor 31*e*. The signal BLCLAMP is supplied to the gate of the transistor 21*m* via a high-voltage transistor 31*f*. The signals BLSo, BLSe, BIASo, BIASe are supplied to the transistors 21*n*, 21*o*, 21*p*, 21*q*, respectively, via high-voltage transistors (not shown).

The input signal to the column decoder 3 is supplied via high-voltage transistors 31*g*1 to 31*gn*. The power supply voltage for the column decoder 3 is supplied from the control signal and control voltage generating circuit 7 via high-voltage transistors (not shown). Signals SW_AD1 to SW_ADn are supplied to the gates of the transistors 31*g*1 to 31*gn*, respectively.

High-voltage transistors 31*h*, 31*i* are connected to the input/output data lines IO, IOn in such a manner that the transistors 31*h*, 31*i* are inserted in the data lines respectively. Signals SW_IO, SW_IOn are supplied to the gates of the transistor 31*h*, 31*i*. A high-voltage transistor 31*j* is connected between the transistor 21*d* and the ground. A signal SW_VSS is supplied to the gate of the transistor 31*j*.

Of the low-voltage n-channel transistors constituting the data storage circuit 10, the source-drain region (N+ region) unconnected with a P+ region is connected to a n-well region (N-well) explained later. Specifically, for example, the source region of the transistor 21*g* constituting the DDC is connected to the anode of a diode 41*a*. The cathode of the diode 41*a* is connected to the n-well region. The junction node of the transistor 21*h* and the transistor 21*i* is connected via a diode 41*b* to the n-well region. The junction node N2 is connected to the n-well region via a diode 41*c*. The drain region of the transistor 21*l* is connected via a diode 41*d* to the n-well region.

The power line L1 for the clocked inverter circuits 21*a*, 21*b* constituting the PDC is connected to the n-well region via a diode 41*e*. The power line L2 is connected to the well region via a diode 41*f*. The input/output lines IO, IOn are connected to the n-well region via diodes 41*g*, 41*h*, respectively. The junction node of the transistors 21*d*, 31*j* is connected to the n-well region via a diode 41*i*.

The power lines L1, L2 have to carry a large current in a normal operation. Thus, the signals SW_Vdd, SW_Vss supplied to the gates of the high-voltage transistors 31*a*, 31*b* have stepped-up voltages. Specifically, for example, a voltage of Vdd+Vthn (Vthn is the threshold voltage of an n-channel transistor) is supplied to the gate of a high-voltage transistor. This suppresses the effect of the threshold voltage of the n-channel transistor. The signals supplied to the gates of other high-voltage transistors may have stepped-up voltages.

Figure 4:
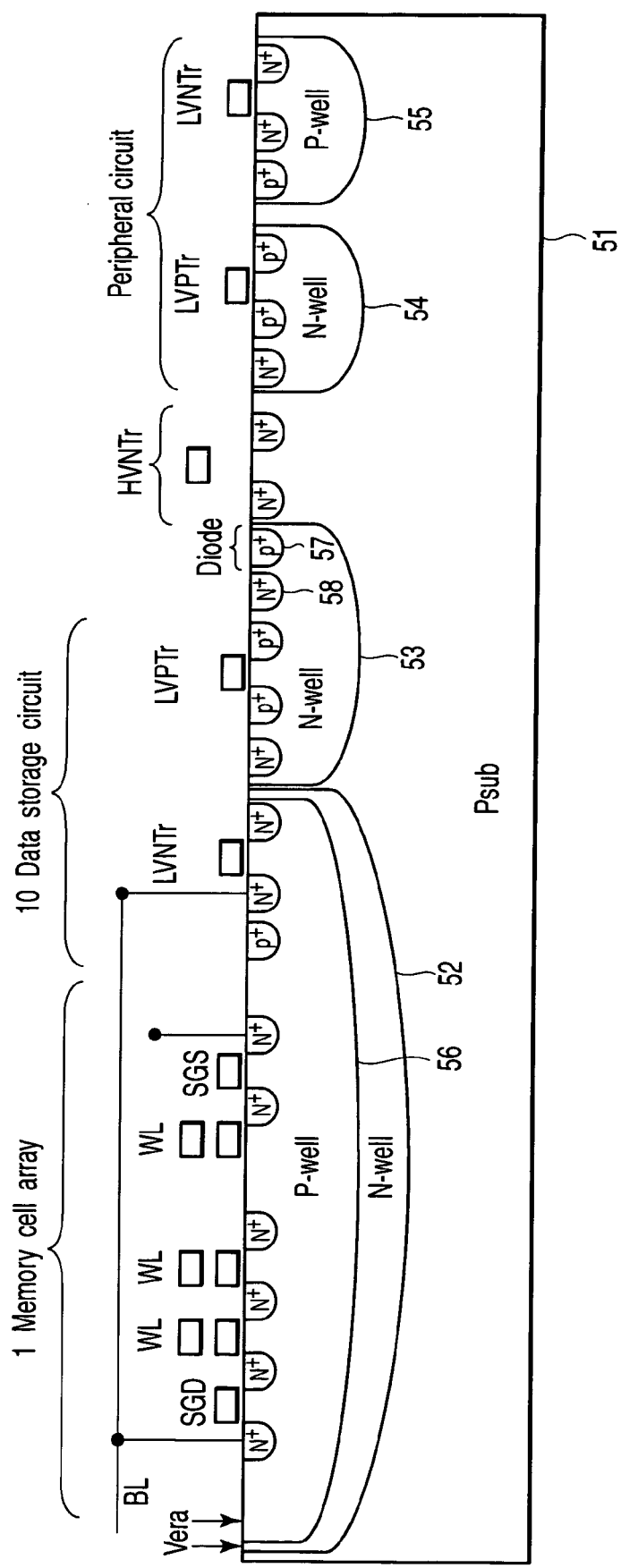
FIG. 4 is a sectional view of a semiconductor memory device according to the embodiment.

FIG. 4 is a sectional view of a semiconductor memory device corresponding to the embodiment. For example, in a p-type semiconductor substrate 51, n-well regions 52, 53, 54 and a p-well region 55 are formed. In the n-well region 52, a p-well region 56 is formed. In the p-well region 56, the memory cell array 1, data storage circuit 10, and a low-voltage n-channel transistor LVNTr constituting the column decoder 3 (not shown) are formed. In addition, in the n-well region 53, a low-voltage p-channel transistor LVPTr constituting the data storage circuit 10, a P+ region 57 constituting the anode of the diodes 41*a* to 41*g*, and an N+ region for supplying a potential to the n-well region 53 are formed. In the substrate 51, high-voltage n-channel transistors HVNTr connected to various signal lines and voltage lines of the data storage circuit 10 are formed. A low-voltage p-channel transistor LVPTr and a low-voltage n-channel transistor LVNTr in a peripheral circuit constituting, for example, the control signal and control voltage generating circuit 7 and the like are formed in the n-well region 54 and p-well region 55, respectively. As shown in FIG. 4, the high-voltage transistor HVNTr has a thicker gate insulating film than the low-voltage transistors LVNTr, LVPTr.

FIG. 5 shows the operating voltages at various sections of FIG. 4 in a normal operation and an erase operation. The n-well region 52 and p-well region 56 are set to the ground potential Vss in a normal operation and to an erase voltage Vera in an erase operation. The n-well region 53 acting as the cathode of a diode is set to the erase voltage Vera in an erase operation and to a power supply voltage Vdd lower than the erase operation Vera in a normal operation.

In the above configuration, the operations of the high-voltage transistors 31a to 31i and diodes 41a to 41h shown in FIG. 1 will be explained.

In a normal operation related to data writing or reading, the high-voltage transistors 31a to 31i are turned on. In this state, various control signals, power supply voltages, and address signals are supplied to the data storage circuit 10, bit line select circuit 10a, column decoder 3, and others via the high-voltage transistors 31a to 31i. The data is inputted to and outputted from the data storage circuit 10 via the input/output lines IO, IOn.

In an erase operation, the high-voltage transistors 31a to 31i are turned off according to the signal supplied to the gates of these transistors. Therefore, even when a high voltage is applied to the well region and each wiring line of the data storage circuit 10 has a high voltage, no high voltage is applied to the control signal and control voltage generating circuit 2.

In an erase operation, for example, the high-voltage transistor 31f is turned off, which brings the gate of the transistor 21m into the floating state. Thereafter, when the voltage of the well region becomes high, the gate of the transistor 21m also goes high through coupling. Since no high voltage is applied to the gate insulating film of the transistor 21m, the destruction of the gate insulating film can be prevented.

In an erase recovery operation of recovering from the erase operation, the high-voltage transistor 31f is caused to remain off, which keeps the gate of the transistor 21m in the floating state. Therefore, the potential of the well region is lowered from the erase voltage Vera, resulting in a drop in the gate voltage of the transistor 21m through coupling.

When the high-voltage transistor 31e is turned off in an erase operation, the drain of the transistor 21l is brought into the floating state. In this state, when the well region is placed at the erase voltage Vera, the transistor 21l is forward-biased, placing the drain of the transistor 21l at a high voltage. However, even when the voltage of the well region is lowered from the erase voltage Vera to Vdd in an erase recovery operation, the drain region of the transistor 21l is reverse-biased and therefore the voltage of the drain region does not drop. To prevent this, the diode 41d is connected to the drain region of the transistor 21l. Since the diode 41d is forward-biased when the voltage of its well region is lowered from the erase voltage Vera to Vdd, the voltage of the drain region of the transistor 21l is discharged via the diode 41d.

Like the diode 41d, the diode 41a discharges the voltage at the junction node of transistor 21g and transistor 21h in an erase recovery operation. The diode 41b also discharges the voltage at the junction node of transistor 21h and transistor 21i in an erase recovery operation.

Furthermore, the node N2 to which the TDC is connected is connected to the source-drain region of an n-channel transistor. That is, the node N2 is connected to the N+ diffused region, but is not connected to a p-channel transistor. Therefore, in an erase operation, the node N2 is forward-biased and is placed at a high voltage. However, since the transistor 21l is reverse-biased even when the voltage of the well region is lowered from the erase voltage Vera to Vdd in an erase recovery operation, the potential at node N2 does not drop. The diode 41c is forward-biased in an erase recovery operation, thereby discharging the voltage at node N2.

In contrast, in an erase operation, the high-voltage transistors 31a, 31b are turned off, bringing the power lines L1, L2 into the floating state. In an erase recovery operation, the voltages on the power lines L1, L2 are discharged via the diodes 41e, 41f.

As described above, high-voltage transistors are inserted in the power lines L1, L2, including Vdd and Vss, and all of the signal lines connected to the data storage circuit 10, including the input/output lines IO, IOn, and address lines Ali. In an erase operation, these high-voltage transistors are turned off, bringing all the wiring lines into the floating state, which places the N+ diffused layer of the n-channel transistor at the high voltage. This prevents the destruction of the data storage circuit 10 composed of only low-voltage transistors.

Moreover, in an erase discovery operation, the high voltage on the N+ diffused layer is discharged into the P+ diffused layer. Accordingly, in the data storage circuit 10, a diode is connected to the node unconnected with the P+ diffused layer, which enables the high voltage to be discharged via the diode.

With the embodiment, the data storage circuit 10 is formed in the same well region as the memory cell array and a plurality of high-voltage transistors are provided between the data storage circuit 10 and column decoder 3 and the peripheral circuits, including the control signal and control voltage generating circuit 7, which prevents not only the destruction of the low-voltage transistors constituting the data storage circuit 10 in an erase operation but also the conduction of the high voltage supplied to the well region to the peripheral circuits. Therefore, there is no need to provide as many high-voltage transistors as or half as many high-voltage transistors as the bit lines between the bit lines and the data storage circuits 10. Accordingly, the number of high-voltage transistors can be reduced remarkably.

Since the high-voltage transistors can be shared by a plurality of data storage circuits 10. Therefore, even when the storage capacity of the semiconductor memory device increases, the advantage is that the number of high-voltage transistors remains unchanged. Thus, the number of high-voltage transistors can be reduced remarkably as compared with a conventional equivalent. In addition, an increase in the chip area can be suppressed.

For example, while a semiconductor memory device with a 4-Gbit capacity requires 128K high-voltage transistors, a semiconductor memory device of the embodiment requires only about 30 high-voltage transistors. Since the value does not change even when the capacity of the semiconductor memory device increases, the chip size reduction effect is outstanding.

The N+ diffused layer unconnected with the P+ diffused layer of a transistor in the data storage circuit is connected to the semiconductor substrate via a diode. Therefore, in an erase recovery operation, the voltage of the N+ diffused layer charged to a high voltage can be discharged reliably.

Furthermore, the data storage circuit 10 and memory cell array 1 are formed in the same well region. Therefore, as compared with a case where the data storage circuit 10 is formed in a well region separate from the memory cell array 1, the area of the well region and the space between well regions can be reduced, which leads to the advantage of decreasing the chip area.

Additional advantages and modifications will readily occur to those skilled in the art. Therefore, the invention in its broader aspects is not limited to the specific details and representative embodiment shown and described herein. Accordingly, various modifications may be made without departing from the spirit or scope of the general inventive concept as defined by the appended claims and their equivalents.

What is claimed is:

1. A semiconductor memory device comprising:
a memory cell array in which a plurality of memory cells connected to word lines and bit lines are arranged in a matrix;
a control circuit which controls the potential on the word lines and bit lines according to input data and which controls the operations of writing data into, reading data from, and erasing data from the memory cells;
a data storage circuit which is connected to the bit lines and which stores data under the control of the control circuit;
a well region in which a part of the data storage circuit and the memory cell array are formed;
a wiring line which connects the data storage circuit and the control circuit; and
a high-voltage transistor which is connected to the line in such a manner that the transistor is inserted in the wiring line and which is turned off in the operation of erasing data.

2. The semiconductor memory device according to claim 1, wherein the high-voltage transistor has its gates applied with a stepped-up voltage and is turned on in reading data and writing data.

3. The semiconductor memory device according to claim 1, wherein the memory cell array is composed of a plurality of NAND cells.

4. A semiconductor memory device comprising:
a memory cell array in which a plurality of memory cells connected to word lines and bit lines are arranged in a matrix;
a control circuit which controls the potential on the word lines and bit lines according to input data and which controls the operations of writing data into, reading data from, and erasing data from the memory cells;
a data storage circuit which is connected to the bit lines and which stores data under the control of the control circuit; and
a well region in which a part of the data storage circuit and the memory cell array are formed;
wherein the data storage circuit includes a plurality of low-voltage transistors and diodes each of which is connected to the drain or source of the corresponding one of the low-voltage transistors.

5. The semiconductor memory device according to claim 4, wherein each of the diodes has its anode connected to the region charged to a high voltage in the erase operation of the low-voltage transistor and has its cathode voltage placed at an erase voltage in an erase operation and set at a voltage lower than the erase voltage in a normal operation.

6. A semiconductor memory device comprising:
a memory cell array in which a plurality of memory cells connected to a plurality of bit lines are arranged;
a control circuit which controls the potential on the bit lines and which controls the operations of writing data into and reading data from, and erasing data from the memory cells;
a plurality of data storage circuits which are connected to the bit lines in a one-to-one correspondence and which store data;
a plurality of high-voltage transistors which are connected to a plurality of wiring lines that provide common connection of said plurality of data storage circuits and the control circuit, in such a manner that the transistors are inserted in the wiring lines in a one-to-one correspondence; and
a well region in which said plurality of data storage circuits and the memory cell array are formed.

7. The semiconductor memory device according to claim 6, wherein the high-voltage transistors are turned off in the erase operation.

8. The semiconductor memory device according to claim 7, wherein the high-voltage transistors have their gates applied with a stepped-up voltage and are turned on in reading data and writing data.

9. The semiconductor memory device according to claim 6, wherein each of the data storage circuits includes
a plurality of low-voltage transistors; and
diodes each of which is connected to the drain or source of the corresponding one of the low-voltage transistors.

10. The semiconductor memory device according to claim 9, wherein each of the diodes has its anode connected to the region charged to a high voltage in the erase operation of the low-voltage transistor and has its cathode voltage placed at an erase voltage in an erase operation and set at a voltage lower than the erase voltage in a normal operation.

11. The semiconductor memory device according to claim 6, wherein the memory cell array is composed of a plurality of NAND cells.

12. A semiconductor memory device comprising:
a memory cell array which has a plurality of memory cells connected to a plurality of bit lines, each of the memory cells including a control gate;
a control circuit which controls the potential on the bit lines and which controls the operations of writing data into and reading data from, and erasing data from the memory cells;
a plurality of data storage circuits which are connected to the bit lines and which store data; and
a first well region in which a part of the data storage circuits is formed; and
a second well region in which the memory cell array and a remaining part of the data storage circuits are formed,
wherein the first and second well regions are supplied with a potential higher than a potential supplied to the control gate during an erase operation.

13. The semiconductor memory device according to claim 12, further comprising:
a plurality of wiring lines which connect said plurality of data storage circuits and the control circuits; and
high-voltage transistors which are connected to the wiring lines in such a manner that the transistors are inserted in the wiring lines in a one-to-one correspondence.

14. The semiconductor memory device according to claim 13, wherein the high-voltage transistors are turned off in the erase operation.

15. The semiconductor memory device according to claim 13, wherein the high-voltage transistors have their gates applied with a stepped-up voltage and are turned on in reading data and writing data.

16. The semiconductor memory device according to claim 13, wherein each of the data storage circuits includes
a plurality of low-voltage transistors; and
diodes each of which is connected to the drain or source of the corresponding one of the low-voltage transistors.

17. The semiconductor memory device according to claim 16, wherein each of the diodes has its anode connected to the region charged to a high voltage in the erase operation of the low-voltage transistor and has its cathode voltage placed at an erase voltage in an erase operation and set at a voltage lower than the erase voltage in a normal operation.

18. The semiconductor memory device according to claim 12, wherein the memory cell array is composed of a plurality of NAND cells.

* * * * *